(12) United States Patent
Yang et al.

(10) Patent No.: US 12,021,068 B2
(45) Date of Patent: Jun. 25, 2024

(54) SEMICONDUCTOR DEVICE WITH DUMMY THERMAL FEATURES ON INTERPOSER

(71) Applicant: MEDIATEK INC., Hsin-Chu (TW)

(72) Inventors: Bo-Jiun Yang, Hsinchu (TW); Wen-Sung Hsu, Hsinchu (TW); Tai-Yu Chen, Hsinchu (TW); Shih-Chin Lin, Hsinchu (TW); Kun-Ting Hung, Hsinchu (TW)

(73) Assignee: MEDIATEK INC., Hsin-Chu (TW)

(*) Notice: Subject to any disclaimer, the term of this patent is extended or adjusted under 35 U.S.C. 154(b) by 204 days.

(21) Appl. No.: 17/492,693

(22) Filed: Oct. 4, 2021

(65) Prior Publication Data

US 2022/0199593 A1    Jun. 23, 2022

Related U.S. Application Data

(60) Provisional application No. 63/128,899, filed on Dec. 22, 2020, provisional application No. 63/137,774, filed on Jan. 15, 2021.

(51) Int. Cl.
| | |
|---|---|
| *H01L 23/02* | (2006.01) |
| *H01L 25/065* | (2023.01) |
| *H01L 25/10* | (2006.01) |

(52) U.S. Cl.
CPC ........ *H01L 25/105* (2013.01); *H01L 25/0657* (2013.01); *H01L 2225/0651* (2013.01); *H01L 2225/06568* (2013.01); *H01L 2225/06582* (2013.01); *H01L 2225/1035* (2013.01); *H01L 2225/1041* (2013.01); *H01L 2225/1058* (2013.01); *H01L 2225/1094* (2013.01)

(58) Field of Classification Search
CPC ............... H01L 25/105; H01L 25/0657; H01L 2225/0651; H01L 2225/06568; H01L 2225/06582; H01L 2225/1035; H01L 2225/1041; H01L 2225/1058; H01L 2225/1094
USPC .......................................................... 257/686
See application file for complete search history.

(56) References Cited

U.S. PATENT DOCUMENTS

| | | | | |
|---|---|---|---|---|
| 9,985,008 | B2* | 5/2018 | Shi | .......................... H01L 25/50 |
| 10,510,734 | B2* | 12/2019 | Chen | ....................... H01L 24/73 |
| 2008/0308950 | A1 | 12/2008 | Yoo | |
| 2016/0181231 | A1* | 6/2016 | Lin | .................... H01L 21/76877 |
| | | | | 257/686 |
| 2018/0068930 | A1* | 3/2018 | Haba | ................... H01L 23/3121 |
| 2018/0269188 | A1 | 9/2018 | Yu | |
| 2019/0115326 | A1 | 4/2019 | Chen | |
| 2019/0311996 | A1 | 10/2019 | Shi | |
| 2019/0333900 | A1 | 10/2019 | Lin | |
| 2020/0006191 | A1 | 1/2020 | Pei | |

FOREIGN PATENT DOCUMENTS

| | | |
|---|---|---|
| TW | 201640628 A | 11/2016 |
| TW | 201836066 A | 10/2018 |

* cited by examiner

*Primary Examiner* — Caleb E Henry
*Assistant Examiner* — Dilinh P Nguyen
(74) *Attorney, Agent, or Firm* — Winston Hsu

(57) ABSTRACT

A semiconductor device includes a bottom package, a top package stacked on the bottom package, and an interposer disposed between the bottom package and the top package. The top package is electrically connected to the interposer through a plurality of peripheral solder balls. At least a dummy thermal feature is disposed on the interposer and surrounded by the plurality of peripheral solder balls.

13 Claims, 7 Drawing Sheets

SEMICONDUCTOR DEVICE WITH DUMMY THERMAL FEATURES ON INTERPOSER

CROSS REFERENCE TO RELATED APPLICATIONS

This application claims priority from U.S. provisional application No. 63/128,899 filed on Dec. 22, 2020 and priority from U.S. provisional application No. 63/137,774 filed on Jan. 15, 2021, the disclosures of which is included in their entirety herein by reference.

BACKGROUND

The present disclosure relates generally to the field of semiconductor packaging. More particularly, the present disclosure relates to a thermally enhanced package-on-package (PoP) with dummy thermal features on an interposer.

The rapid development of electronic devices that has occurred in recent years has prompted the demand for greater functionality in consumer electronics, with a particular emphasis on multifunctionality, miniaturization, and weight reduction. These restrictions have rendered the design of microelectronic structures much more complex and challenging, since the semiconductor technology has remained relatively unchanged.

High-bandwidth package on package (HBPoP) has been introduced as a potential candidate for the processor that can be incorporated into smartphones, tablets, and other consumer electronics. The advantages of the HBPoP stems from high-bandwidth and short path of signal transmission suited for high-performance computing.

However, compared to the flip-chip chip scale package (FCCSP), the thermal performance of HBPoP is worse because of the extra thermal resistance of the DRAM top package. Besides, the HBPoP has worse reliability since the solder balls between the interposer and the DRAM top package are not protected. It is difficult to fill the gap between the interposer and the DRAM top package with underfill.

SUMMARY

It is one object of the present invention to provide a semiconductor package with improved reliability and thermal performance in order to solve the above-mentioned prior art problems or shortcomings.

One aspect of the invention provides a semiconductor device including a bottom package, a top package stacked on the bottom package, and an interposer disposed between the bottom package and the top package. The top package is electrically connected to the interposer through a plurality of peripheral solder balls. A plurality of dummy metal features is disposed on the interposer and surrounded by the plurality of peripheral solder balls. The plurality of dummy metal features is formed on respective dummy pads of the interposer. Each of the plurality of dummy metal features has a height that is smaller than that of the peripheral solder balls.

According to some embodiments, the semiconductor device further comprises a capillary underfill disposed in a gap between the interposer and the top package.

According to some embodiments, the capillary underfill surrounds and protects the peripheral solder balls and is in direct contact with the plurality of dummy metal features.

According to some embodiments, the plurality of dummy metal features comprises copper bumps or copper pillars.

According to some embodiments, the plurality of dummy metal features comprises solder balls.

According to some embodiments, the top package is a memory package.

According to some embodiments, the memory package comprises at least one memory chip mounted on a top substrate.

According to some embodiments, the memory chip comprises a high-bandwidth memory (HBM) or a low-power DRAM (LPDRAM) chip.

According to some embodiments, the memory chip is electrically connected to the top substrate through bond wires.

According to some embodiments, each of the plurality of the dummy metal features is not in direct contact with a bottom surface of the top substrate.

According to some embodiments, the bottom package comprises a semiconductor chip mounted on a bottom substrate in a flip-chip manner.

According to some embodiments, the bottom substrate comprises a three-layer or four-layer coreless embedded trace substrate.

According to some embodiments, the semiconductor chip comprises a logic die or a system on a chip (SoC) and the semiconductor chip is encapsulated by an over-mold.

According to some embodiments, the interposer comprises interconnect structure electrically connected to through mold vias embedded in the over-mold and around the semiconductor chip.

According to some embodiments, at least some of the dummy pads are electrically connected to a ground trace or ground structure in the interposer.

Another aspect of the invention provides a semiconductor device including a bottom package, a top package stacked on the bottom package, and an interposer disposed between the bottom package and the top package. The top package is electrically connected to the interposer through a plurality of peripheral solder balls. A thermal die disposed on the interposer and surrounded by the plurality of peripheral solder balls.

According to some embodiments, the thermal die is adhered to a top surface of the interposer by using an adhesive layer.

According to some embodiments, the top package is a memory package.

According to some embodiments, the memory package comprises at least one memory chip mounted on a top substrate.

According to some embodiments, the memory chip comprises a high-bandwidth memory (HBM) or a low-power DRAM (LPDRAM) chip.

According to some embodiments, the memory chip is electrically connected to the top substrate through bond wires.

According to some embodiments, the thermal die is not in direct contact with a bottom surface of the top substrate.

According to some embodiments, the bottom package comprises a semiconductor chip mounted on a bottom substrate in a flip-chip manner.

According to some embodiments, the semiconductor chip comprises a logic die or a system on a chip (SoC) and the semiconductor chip is encapsulated by an over-mold.

According to some embodiments, the interposer comprises interconnect structure electrically connected to through mold vias embedded in the over-mold and around the semiconductor chip.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings:

FIG. 4 to FIG. 10 illustrate various layout of the dummy metal features on the interposer according to some embodiments, wherein FIG. 7 is a cross-sectional view taken along line II-II' in FIG. 6 and FIG. 9 is a cross-sectional view taken along line III-III' in FIG. 8.

DETAILED DESCRIPTION

In the following detailed description of embodiments of the invention, reference is made to the accompanying drawings, which form a part hereof, and in which is shown by way of illustration specific preferred embodiments in which the disclosure may be practiced.

These embodiments are described in sufficient detail to enable those skilled in the art to practice them, and it is to be understood that other embodiments may be utilized and that mechanical, chemical, electrical, and procedural changes may be made without departing from the spirit and scope of the present disclosure. The following detailed description is, therefore, not to be taken in a limiting sense, and the scope of embodiments of the present invention is defined only by the appended claims.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

The present disclosure pertains to a thermally enhanced package-on-package (PoP) and may be suited for high-bandwidth PoP (HBPoP) or Info-PoP. PoP is referred to as a semiconductor packaging scheme that involves stacking one chip package on top of another chip package. For example, a PoP may combine vertically discrete memory and logic ball grid array (BGA) packages. In PoP package designs, the top package may be interconnected to the bottom package through peripheral solder balls.

The thermal performance of HBPoP is not satisfactory because of the extra thermal resistance of the DRAM top package. Besides, the HBPoP has worse reliability since the solder balls between the interposer and the DRAM top package are not protected. The present invention addresses these issues. According to some embodiments, the HBPoP is provided with dummy thermal features such as dummy metal features or thermal die disposed on an interposer.

Figure 1:
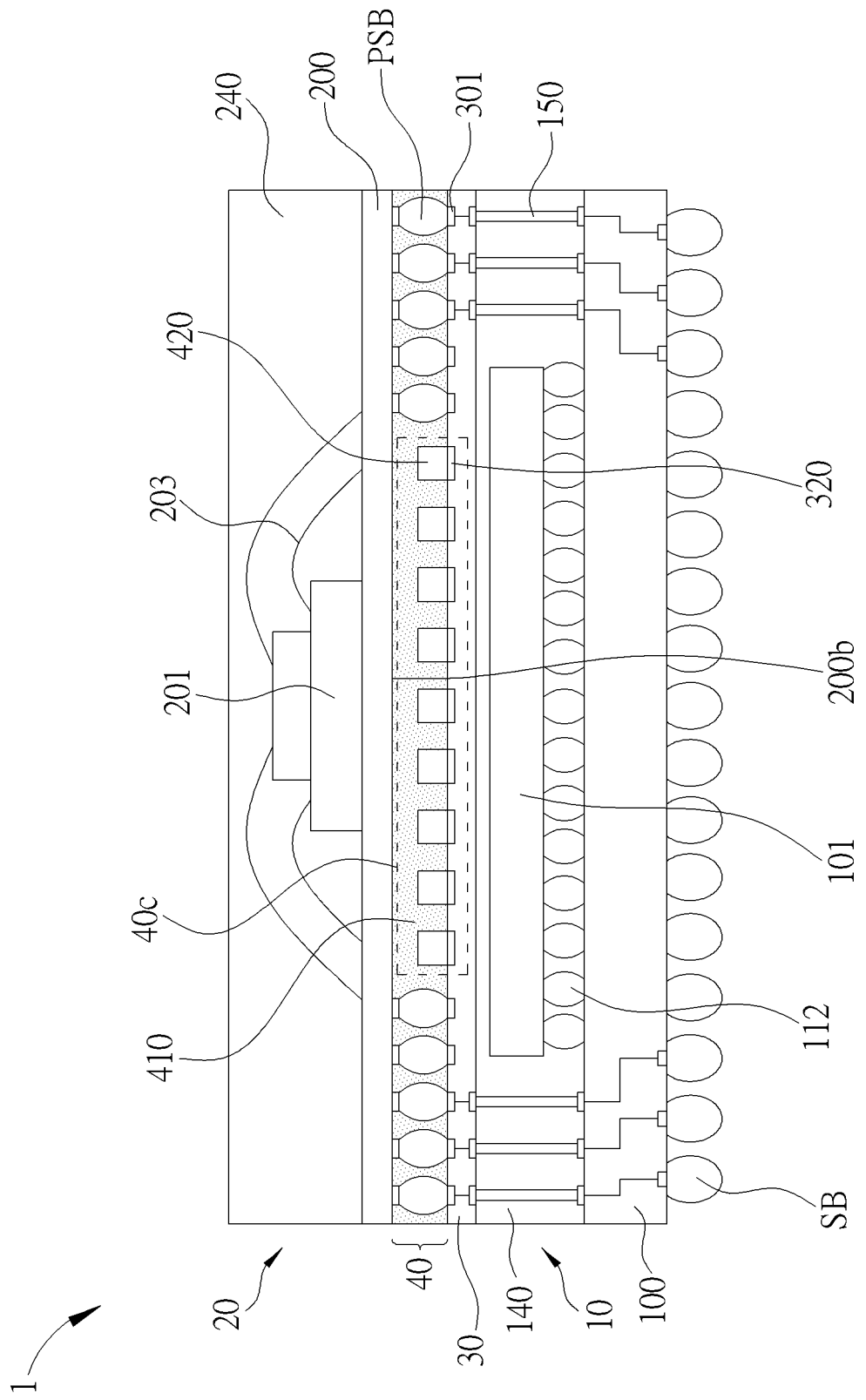
FIG. 1 is a schematic, cross-sectional diagram showing an exemplary PoP according to one embodiment of the invention.

FIG. 1 is a schematic, cross-sectional diagram showing an exemplary PoP according to one embodiment of the invention. As shown in FIG. 1, the PoP 1 comprises a bottom package 10 and a top package 20 stacked on the bottom package 10. According to an embodiment, the top package 20 may be a memory package, but not limited thereto. According to an embodiment, the bottom package 10 may comprise a semiconductor chip 101 mounted on a package substrate (or bottom substrate) 100 in a flip-chip manner. According to an embodiment, for example, the package substrate 100 may be a three-layer (3L) or four-layer (4L) coreless embedded trace substrate (ETS), but not limited thereto. According to an embodiment, the semiconductor chip 101 such as a logic die or a system on a chip (SoC) may be electrically connected to the package substrate 100 through a plurality of connecting elements 112 such as copper bumps, pillars or micro-bumps, but not limited thereto.

According to an embodiment, on a lower surface of the package substrate 100, a plurality of ball grid array (BGA) balls SB may be provided. For example, the pitch of the BGA balls SB at the lower surface of the package substrate 100 may be equal to or smaller than 0.35 mm, but not limited thereto. The semiconductor chip 101 may be encapsulated by an over-mold 140, for example, an engineering molding compound.

According to an embodiment, for example, the top package 20 may comprise at least one memory chip 201 mounted on a package substrate (or top substrate) 200. According to an embodiment, for example, the memory chip 201 may be a high-bandwidth memory (HBM) or a low-power DRAM (LPDRAM) chip, but not limited thereto. According to an embodiment, for example, the memory chip 201 may be electrically connected to the package substrate 200 through bond wires 203. The memory chip 201, the bond wires 203, and the top surface 200a of the package substrate 200 are encapsulated by an over-mold (or top over-mold) 240.

According to an embodiment, the top package 20 is electrically connected to the bottom package 10 through an intervening interposer 30. According to an embodiment, for example, the interposer 30 may be a two-layer cored substrate, but not limited thereto. The interposer 30 may comprise interconnect structure 301 that is electrically connected to through mold vias 150 such as copper pillars that are embedded in the over-mold 140 and disposed around the perimeter of the semiconductor chip 101.

According to an embodiment, the top package 20 is mounted on the interposer 30 and is electrically connected to the interposer 30 through the plurality of peripheral solder balls PSB. According to an embodiment, a small gap 40 is formed between the top package 20 and the interposer 30. According to an embodiment, the gap 40 is filled with capillary underfill 410. The capillary underfill 410 surrounds and protects the peripheral solder balls PSB, thereby improving the reliability of the PoP 1.

According to an embodiment, to facilitate the formation of the capillary underfill 410 within the gap 40, a plurality of dummy metal features 420 such as copper pillar or bump patterns may be provided at a central region 40c of the gap 40, which is surrounded by the peripheral solder balls PSB and is located directly above the semiconductor chip 101. The dummy metal features 420 may be formed by any suitable methods known in the art, for example, plating or deposition.

By providing the dummy metal features 420 on the interposer 30, the capillary underfill 410 can be filled into the gap 40 using capillary effect. According to an embodiment, each of the dummy metal features 420 has a height that is smaller than that of the peripheral solder balls PSB, so that the dummy metal features 420 are not in direct contact with a bottom surface 200b of the package substrate 200. According to an embodiment, the dummy metal features 420 may be formed on respective dummy pads 320 of the interposer 30. However, it is understood that in some embodiments, the dummy metal features 420 may have a height that is equal to that of the peripheral solder balls PSB, so that the dummy metal features 420 are in direct contact with the bottom surface 200b of the package substrate 200.

According to an embodiment, the dummy pads 320 may be electrically floating pads, meaning that no via is formed directly under the dummy pads 320 to electrically connect the dummy pads 320 to any other interconnect structure in the interposer 30. According to another embodiment, at least some of the dummy pads 320 may be electrically connected to a ground trace or ground structure in the interposer 30. It is also beneficial to use the dummy metal features 420 to dissipate the heat generated by the semiconductor chip 101. The capillary underfill 410 and the dummy metal features 420 together enhance the thermal performance of the PoP 1.

Figure 2:
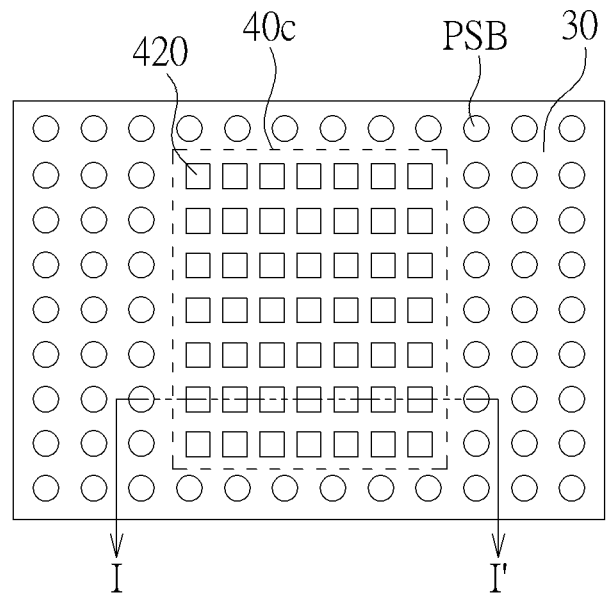
FIG. 2 is a perspective top view showing an exemplary layout of the dummy metal features on the interposer.
Figure 3:
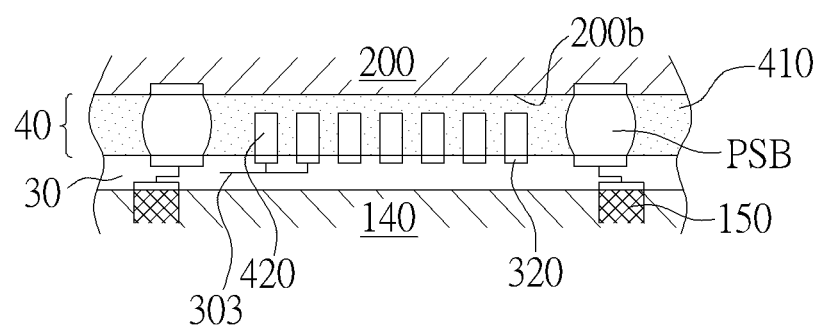
FIG. 3 is a cross-sectional view taken along line I-I' in FIG. 2.

FIG. 2 is a perspective top view showing an exemplary layout of the dummy metal features on the interposer, wherein like numeral numbers designate like elements, regions or layers. FIG. 3 is a cross-sectional view taken along line I-I' in FIG. 2. As shown in FIG. 2 and FIG. 3, a 7×7 copper pillar or bump array is demonstrated as an example of the dummy metal features on the interposer. It is to be understood that the layout and number of the dummy metal features 420 and the peripheral solder balls PSB are for illustration purposes only. In FIG. 3, the dummy metal features 420 are not in direct contact with the bottom surface 200b of the package substrate 200. By connecting at least some of the dummy pads 320 to a ground trace or ground structure 303 in the interposer 30, the heat dissipation efficiency may be further improved. Hence, the capillary underfill 410, the dummy metal features 420 or the dummy pads 320 may function as a heat dissipating element of the POP1. In some embodiments, the dummy metal features 420 may be in direct contact with the bottom surface 200b of the package substrate 200.

Figure 4:
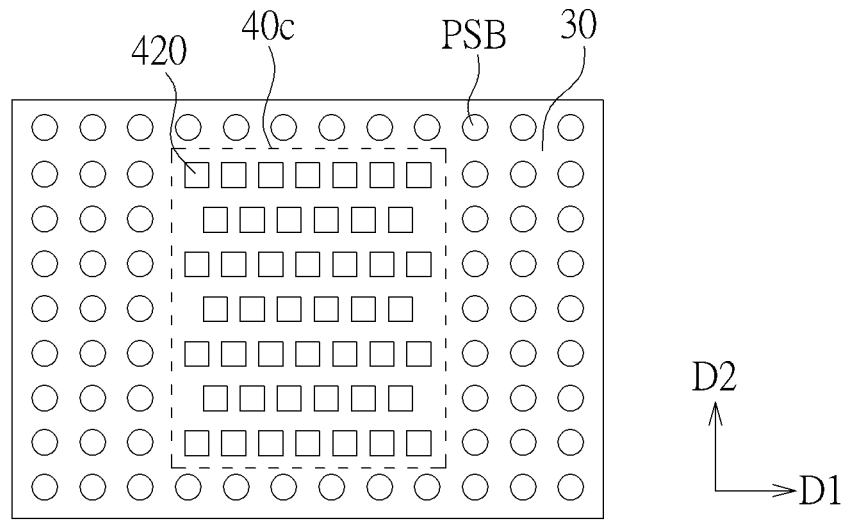
Figure 5:
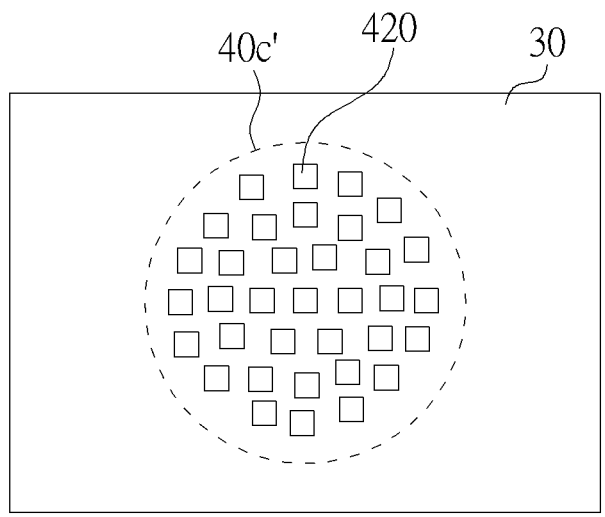
Figure 6:
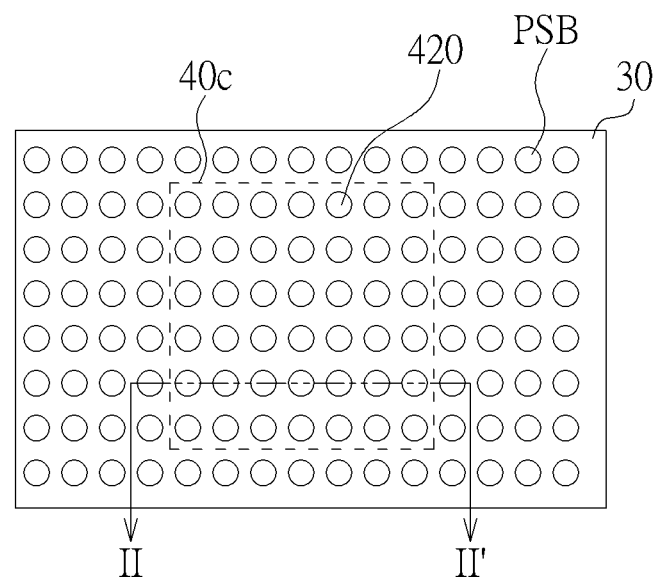
Figure 7:
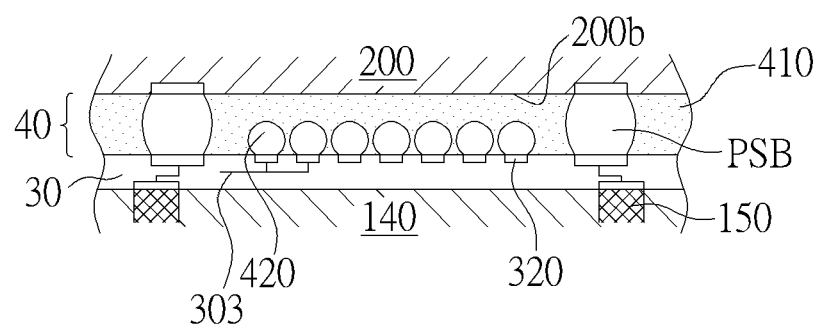
Figure 8:
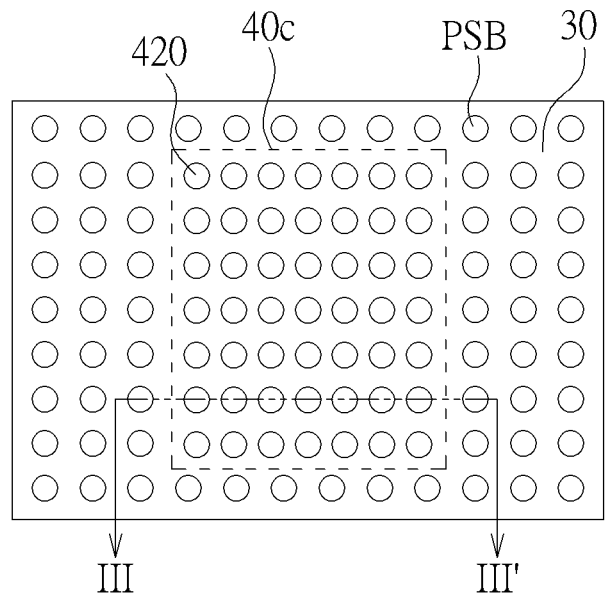
Figure 9:
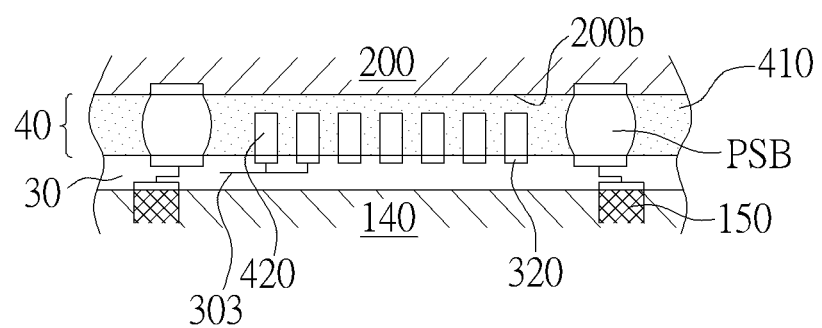

FIG. 4 to FIG. 10 illustrate various layout of the dummy metal features on the interposer according to some embodiments, wherein FIG. 7 is a cross-sectional view taken along line II-II' in FIG. 6 and FIG. 9 is a cross-sectional view taken along line III-III' in FIG. 8. As shown in FIG. 4, the dummy metal features 420 may be aligned with one another along a first direction D1 and are arranged in a staggered manner along a second direction D2. As shown in FIG. 5, the dummy metal features 420 may be arranged within a circular region 40c'.

As shown in FIG. 6 and FIG. 7, the dummy metal features 420 may be solder balls. In FIG. 7, the dummy metal features 420 are not in direct contact with the bottom surface 200b of the package substrate 200. However, it is understood that in some embodiments, the dummy metal features 420 may be in direct contact with the bottom surface 200b of the package substrate 200.

As shown in FIG. 8 and FIG. 9, the dummy metal features 420 may have a cylindrical shape. In FIG. 9, the dummy metal features 420 are not in direct contact with the bottom surface 200b of the package substrate 200. However, it is understood that in some embodiments, the dummy metal features 420 may be in direct contact with the bottom surface 200b of the package substrate 200.

Figure 10:
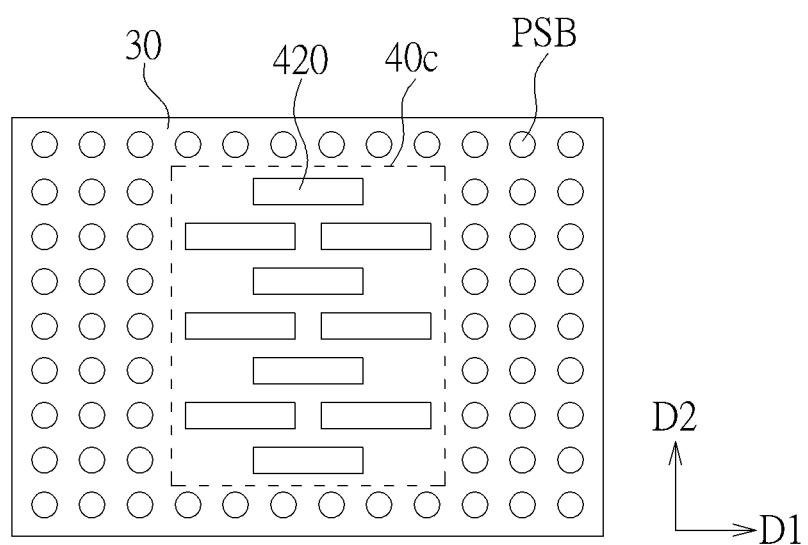

As shown in FIG. 10, each of the dummy metal features 420 may have a strip shape or a bar shape extending along the first direction D1 and arranged in a staggered manner along the second direction D2. In FIG. 10, the capillary underfill 410 may be injected into the gap 40 along the first direction D1.

Figure 11:
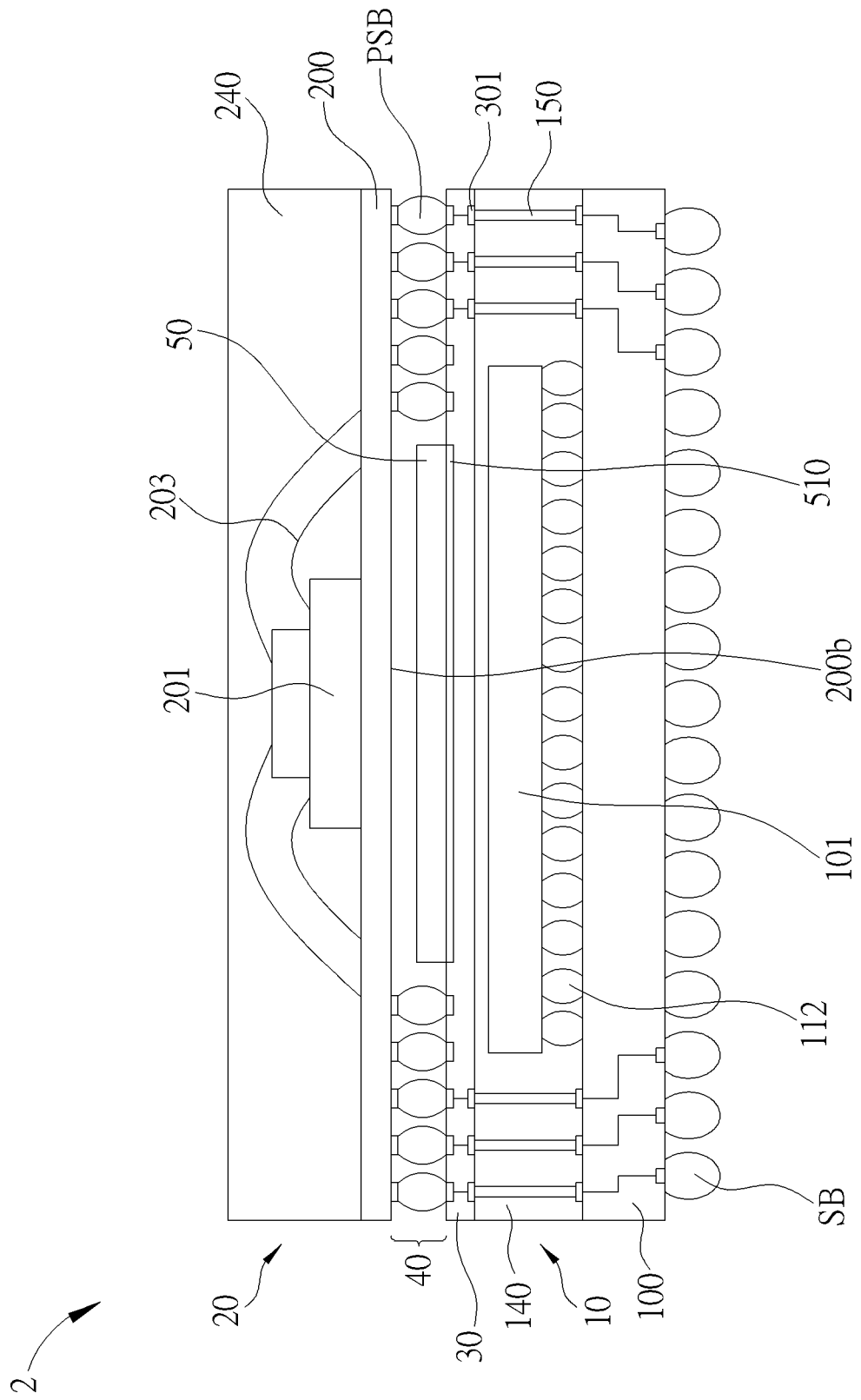
FIG. 11 is a schematic, cross-sectional diagram showing an exemplary PoP according to another embodiment of the invention.

Please refer to FIG. 11. FIG. 11 is a schematic, cross-sectional diagram showing an exemplary PoP according to another embodiment of the invention. As shown in FIG. 11, likewise, the PoP 2 comprises a bottom package 10 and a top package 20 stacked on the bottom package 10. According to an embodiment, the top package 20 may be a memory package, but not limited thereto. According to an embodiment, the bottom package 10 may comprise a semiconductor chip 101 mounted on a package substrate 100 in a flip-chip manner. According to an embodiment, for example, the package substrate 100 may comprise a three-layer or four-layer coreless embedded trace substrate (ETS), but not limited thereto. According to an embodiment, the semiconductor chip 101 such as a logic die or a system on a chip may be electrically connected to the package substrate 100 through a plurality of connecting elements 112 such as copper bumps, pillars or micro-bumps, but not limited thereto.

According to an embodiment, on a lower surface of the package substrate 100, a plurality of BGA balls SB may be provided. For example, the pitch of the BGA balls SB at the lower surface of the package substrate 100 may be equal to or smaller than 0.35 mm, but not limited thereto. The semiconductor chip 101 may be encapsulated by an over-mold 140, for example, an engineering molding compound.

According to an embodiment, for example, the top package 20 may comprise at least one memory chip 201 mounted on a package substrate 200. According to an embodiment, for example, the memory chip 201 may be a HBM or a LPDRAM chip, but not limited thereto. According to an embodiment, for example, the memory chip 201 may be electrically connected to the package substrate 200 through bond wires 203. The memory chip 201, the bond wires 203, and the top surface 200a of the package substrate 200 are encapsulated by an over-mold 240.

According to an embodiment, the top package 20 is electrically connected to the bottom package 10 through an intervening interposer 30. According to an embodiment, for example, the interposer 30 may be a two-layer cored substrate, but not limited thereto. The interposer 30 may comprise interconnect structure 301 that is electrically connected to through mold vias 150 such as copper pillars that are embedded in the over-mold 140 and disposed around the perimeter of the semiconductor chip 101.

According to an embodiment, the top package 20 is mounted on the interposer 30 and is electrically connected to the interposer 30 through the plurality of peripheral solder balls PSB. According to an embodiment, a small gap 40 is formed between the top package 20 and the interposer 30. According to an embodiment, a thermal die 50 such as a dummy silicon die is provided on the interposer 30 and is surrounded by the peripheral solder balls PSB. The thermal die 50 may be adhered to a top surface of the interposer 30 by using an adhesive layer 510. According to an embodiment, the thermal die 50 has a height that is smaller than that of the peripheral solder balls PSB, so that the thermal die 50 is not in direct contact with the bottom surface 200*b* of the package substrate 200.

According to an embodiment, the thermal die 50 may be electrically floating, meaning that no connection is formed under the thermal die 50 to electrically connect the thermal die 50 to any other interconnect structure in the interposer 30. It is also beneficial to use the thermal die 50 to dissipate the heat generated by the semiconductor chip 101 because using the thermal die 50 is more cost-effective.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a bottom package, wherein the bottom package comprises a semiconductor chip;
   a top package stacked on the bottom package;
   an interposer disposed between the bottom package and the top package, wherein the top package is electrically connected to the interposer through a plurality of peripheral solder balls; and
   a plurality of dummy copper pillars arranged in an array and disposed on the interposer and surrounded by the plurality of peripheral solder balls, wherein the plurality of dummy copper pillars is formed on respective dummy pads of the interposer, wherein the dummy pads are disposed directly above the semiconductor chip and bottom surfaces of the plurality of dummy copper pillars directly contact the respective dummy pads of the interposer, and wherein each of the plurality of dummy copper pillars has a height that is smaller than that of the peripheral solder balls.

2. The semiconductor device according to claim 1 further comprises:
   a capillary underfill disposed in a gap between the interposer and the top package.

3. The semiconductor device according to claim 2, wherein the capillary underfill surrounds and protects the peripheral solder balls and is in direct contact with the plurality of dummy copper pillars.

4. The semiconductor device according to claim 1, wherein the top package is a memory package.

5. The semiconductor device according to claim 4, wherein the memory package comprises at least one memory chip mounted on a top substrate.

6. The semiconductor device according to claim 5, wherein the memory chip comprises a high-bandwidth memory (HBM) or a low-power DRAM (LPDRAM) chip.

7. The semiconductor device according to claim 5, wherein the memory chip is electrically connected to the top substrate through bond wires.

8. The semiconductor device according to claim 5, wherein each of the plurality of the dummy metal features is not in direct contact with a bottom surface of the top substrate.

9. The semiconductor device according to claim 1, wherein the-semiconductor chip is mounted on a bottom substrate in a flip-chip manner.

10. The semiconductor device according to claim 9, wherein the bottom substrate comprises a three-layer or four-layer coreless embedded trace substrate.

11. The semiconductor device according to claim 9, wherein the semiconductor chip comprises a logic die or a system on a chip (SoC) and the semiconductor chip is encapsulated by an over-mold.

12. The semiconductor device according to claim 9, wherein the interposer comprises an interconnect structure electrically connected to through mold vias embedded in the over-mold and around the semiconductor chip.

13. The semiconductor device according to claim 1, wherein at least some of the dummy pads are electrically connected to a ground trace or ground structure in the interposer.

\* \* \* \* \*